United States Patent
Pinter et al.

(10) Patent No.: US 8,462,415 B2
(45) Date of Patent: Jun. 11, 2013

(54) CONNECTING STRUCTURE FOR MICROMECHANICAL OSCILLATING DEVICES

(75) Inventors: Stefan Pinter, Reutlingen (DE); Andreas Duell, Stuttgart (DE); Joerg Muchow, Reutlingen (DE); Zoltan Lestyan, Martonvasar (HU)

(73) Assignee: Robert Bosch GmbH, Stuttgart (DE)

( * ) Notice: Subject to any disclaimer, the term of this patent is extended or adjusted under 35 U.S.C. 154(b) by 155 days.

(21) Appl. No.: 13/106,453

(22) Filed: May 12, 2011

(65) Prior Publication Data

US 2011/0286069 A1 Nov. 24, 2011

(30) Foreign Application Priority Data

May 18, 2010 (DE) .......................... 10 2010 029 074

(51) Int. Cl.
 *G02B 26/08* (2006.01)
(52) U.S. Cl.
 USPC ...................................... 359/224.1
(58) Field of Classification Search
 USPC .......................................... 359/223.1–226.1
 See application file for complete search history.

(56) References Cited

U.S. PATENT DOCUMENTS

| 6,672,732 B1 | 1/2004 | Niendorf et al. |
| 2008/0143451 A1* | 6/2008 | Sprague et al. ............ 359/226.1 |
| 2008/0168670 A1 | 7/2008 | Ko et al. |

FOREIGN PATENT DOCUMENTS

| EP | 1944596 | 7/2008 |
| WO | WO 0101187 | 1/2001 |

* cited by examiner

*Primary Examiner* — Euncha Cherry
(74) *Attorney, Agent, or Firm* — Kenyon & Kenyon LLP

(57) ABSTRACT

A connecting structure for micromechanical oscillating devices, in particular micromechanical oscillating mirrors. The connecting structure is at least indirectly connectable to a micromechanical oscillating structure, on the one hand, and to an elastic element, on the other hand, for measuring torsions of the micromechanical oscillating structure, and includes at least one, in particular at least two, preferably three, legs which are situated parallel to a rotation axis of the micromechanical oscillating structure, and at least one further leg which is situated perpendicularly to the rotation axis. The extension of the connecting structure parallel to the rotation axis has at least two-and-a-half times, in particular three times, the extension of the connecting structure perpendicular to the rotation axis, and includes at least one resistance element for measuring torsions of the connecting structure, the resistance element being situated in the area of increased mechanical stress when the connecting structure undergoes torsion.

16 Claims, 4 Drawing Sheets

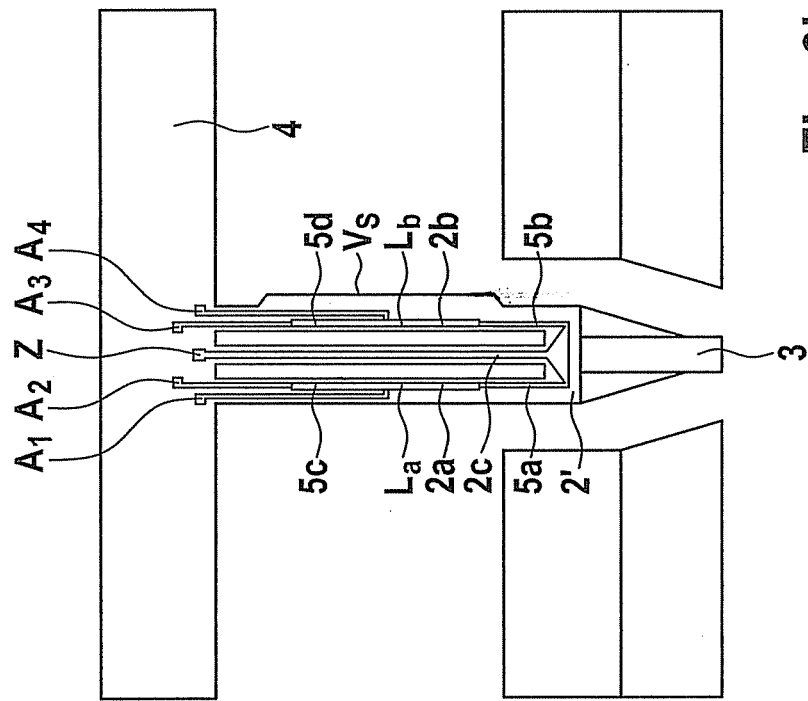
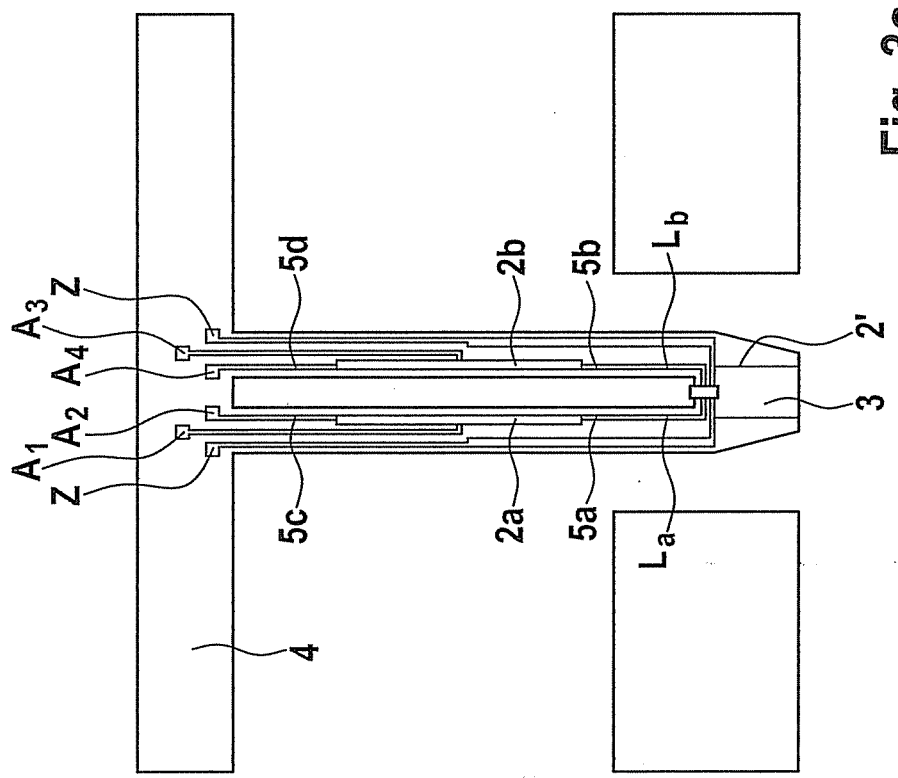

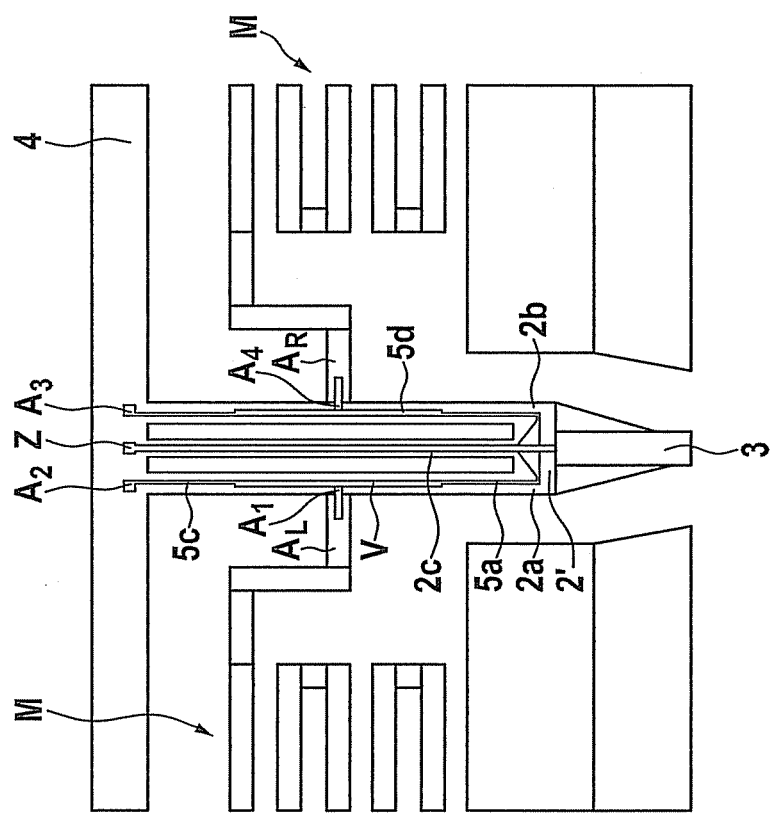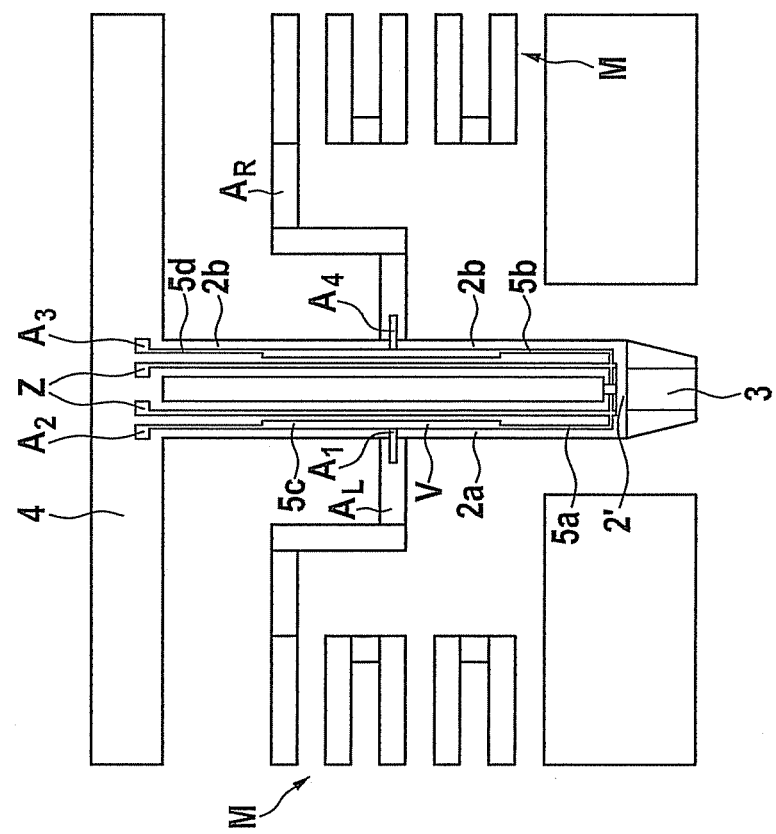

CONNECTING STRUCTURE FOR MICROMECHANICAL OSCILLATING DEVICES

CROSS REFERENCES

The present application claims the benefit under 35 U.S.C. §119 OF German Patent Application No. 102010029074.2, filed on May 18, 2010, which is expressly incorporated herewith by reference in its entirety.

FIELD OF THE INVENTION

The present invention relates to a connecting structure for micromechanical oscillating devices, in particular micromechanical oscillating mirrors.

BACKGROUND INFORMATION

A micromechanical oscillating device is described in European Patent No. EP 1 212 650 B1. The micromechanical oscillating device includes an oscillating structure on a rectangular plate. The oscillating structure is connected to an elastic structure in the form of a torsion spring element via a connecting structure. This torsion spring element, in turn, is connected to a support structure for the micromechanical oscillating device. The connecting structure has a largely U-shaped design. It is used to convert external forces which act upon the torsion spring element in a largely perpendicular manner to a torsion axis at least partially to forces which act upon the torsion spring element parallel to the torsion axis.

In order to control micromechanical oscillating devices, in particular micromechanical oscillating mirrors, in a regulated manner, it is necessary to detect the current position of the micromechanical oscillating device.

When the micromechanical oscillating structure changes position, mechanical stresses, which may be piezoresistively converted into electric signals with the aid of resistors, form in areas in which a micromechanical oscillating structure is connected to the support structure. The position of the micromechanical oscillating structure may then be detected on the basis of these signals.

A piezoresistive system of this type is described in European Patent No. EP 1 944 596 A1. The rotating microelectromechanical system includes four resistors which are located at a 45° angle to each other relative to a torsion axis. When the micromechanical oscillating structure changes position, mechanical stresses, which are piezoresistively converted into electrical signals with the aid of the resistors, form in areas in which a micromechanical oscillating structure is connected to the support structure. The position of the micromechanical oscillating structure may then be detected on the basis of these signals.

SUMMARY

The connecting structure of micromechanical oscillating devices, in particular micromechanical oscillating mirrors, in accordance with the present invention may have the advantage that the sensitivity of the resistors toward the torsions is as great as possible, so that a current position of a micromechanical oscillating device connected to the connecting structure may be very precisely detected reliably and without errors.

According to a further advantageous refinement of the present invention, the resistance element includes at least four resistors arranged in the form of a Wheatstone bridge, which is situated in the area of the connection between the connecting structure and the micromechanical oscillating structure and/or the connecting structure and the elastic element. The advantage of this system is that it causes the resistors of the resistance element to be situated in the areas of the connecting structure which achieve the greatest possible deformation of the connecting structure upon torsion around the rotation axis and thus enable a high degree of precision in detecting torsions due to a change in position of a micromechanical oscillating structure connected to the connecting structure.

According to a further advantageous refinement of the present invention, the resistance element includes at least one piezoresistive crystal, a <110> direction of the piezoresistive crystal being situated parallel to the rotation axis. An advantage of this is that it permits reliable and easy etching using potassium hydride if silicon is used in the manufacture of the connecting structure.

According to a further advantageous refinement of the present invention, the resistance element is situated on at least one outer leg, and/or a supply line for supplying voltage for the resistance element is situated on the inner leg. An advantage of this is that the supply line for the resistance element on the outer leg may be situated on the inner leg, i.e., the leg situated between the two outer legs, so that the supply line does not have to be also situated on the outer leg.

The outer leg may have a correspondingly narrower design in terms of its width, i.e., its extension perpendicular to the torsion axis, which on the whole results in a further increase in the sensitivity of the detection of torsions by the resistors. If the resistance element is situated on the two outer legs, both legs may be provided with a correspondingly narrower design. The inner leg may then have a width which is greater than, in particular, the minimum width of at least one outer leg to further increase sensitivity in the measurement of torsions.

According to a further preferred refinement of the present invention, the supply line is established with the aid of deep diffusion, in particular at a depth of more than 1 micrometer, preferably more than 8 micrometers, and/or the resistance element is provided with the aid of shallow diffusion, in particular at a depth of less than 1 micrometer. An advantage of this is that it further reduces the electrical resistance in the supply line and, at the same time, increases the resistance of the resistance element relative thereto, so that a voltage drop occurs mainly in the area of the resistance element. This further increases the sensitivity of the measurement of torsions.

According to a further preferred refinement of the present invention, at least one outer leg has a widened leg section in its inner area and, in particular, at least one resistor of the resistance element in the form of a conductor track includes at least one leg having a widened section. An advantage of this is that higher mechanical stresses, in particular those of tensile and/or compression forces, occur in the area of the resistance element, in particular the resistors, which have a more narrow design. A higher voltage drop then occurs here, which increases the sensitivity of the measurement of torsions even further. "Conductor tracks" are understood to also be diffused regions or diffused resistors.

According to a further preferred refinement of the present invention, the at least one resistor in the form of the conductor track in the area of the at least one end of the leg has a width of less than 2 µm, in particular less than 1.5 µm. The advantage of this is that it ensures a very high sensitivity in the detection of torsions of the micromechanical oscillating structure.

According to a further preferred refinement of the present invention, a tapping structure for tapping a voltage of at least one resistor is situated on at least one of the outer legs, the tapping of the voltage taking place, in particular, on half the length of the outer leg for forming the Wheatstone bridge in the area of the widened section. An advantage of this is that tapping is carried out for the Wheatstone bridge on largely half the extension of the particular resistor, and no additional tap via a conductor track must thus be situated on the particular leg, but instead, the voltage may be tapped directly from the leg, on the side, in particular largely perpendicularly to the leg. The width of the leg, i.e., its extension perpendicular to the rotation axis, is further reduced, and the sensitivity to the detection of torsions by the resistance element is increased even further.

According to a further preferred refinement of the present invention, the tapping structure is designed in the form of an at least triple meander. An advantage of this is that, through these means, the tapping structure impairs the torsion of the connecting structure by the micromechanical oscillating structure as little as possible, due to the connection of the tapping structure to the leg of the connecting structure which at least partially absorbs the torsion. This even further increases precision in the detection of the position of the micromechanical oscillating structure with the aid of the torsion of the connecting structure.

According to a further preferred refinement of the present invention, the two legs have a distance parallel to the torsion axis which is smaller than, in particular half, the length of the leg perpendicular to the rotation axis. An advantage of this is that it increases the sensitivity of the measurement of torsions even further.

Within the scope of the present invention, it is also possible to apply voltage to the voltage for the Wheatstone bridge via the tap and to then tap this voltage on corresponding supply lines for the resistors of the resistance element. The voltage drop across the supply line for the resistors should be as small as possible. The smaller the voltage drop across the supply line, the higher the precision for detecting the torsions, since the remaining and larger portion of the voltage drop then occurs at the resistance element. If the resistors are arranged in the form of a Wheatstone bridge, they are limited to a total of approximately 1 kΩ, since the resistors are limited in length, i.e., in their extension parallel to the torsion axis in the areas of high mechanical stress.

Furthermore, no metal is situated in the area of high mechanical stress or torsion, since this leads to mechanical deformation of the metal and, in this manner, the metal is at least partially destroyed over time due to the load caused by the torsion.

The tapping structure may furthermore have a preferably soft or resilient design in comparison with the connecting structure, so that influence or impairment of the torsion of the legs by the tapping structure is minimized. If the tapping structure is provided with a corresponding design, it is possible to use a metal as the supply line on the tapping structure to minimize the supply line resistance.

BRIEF DESCRIPTION OF THE DRAWINGS

Exemplary embodiments of the present invention are illustrated in the figures and explained in greater detail below.

FIG. 3 shows a connecting structure according to a fourth and a fifth specific embodiment of the present invention.

FIG. 4 shows a sixth and a seventh specific embodiment of a connecting structure according to the present invention.

DETAILED DESCRIPTION OF EXAMPLED EMBODIMENTS

Figure 1:
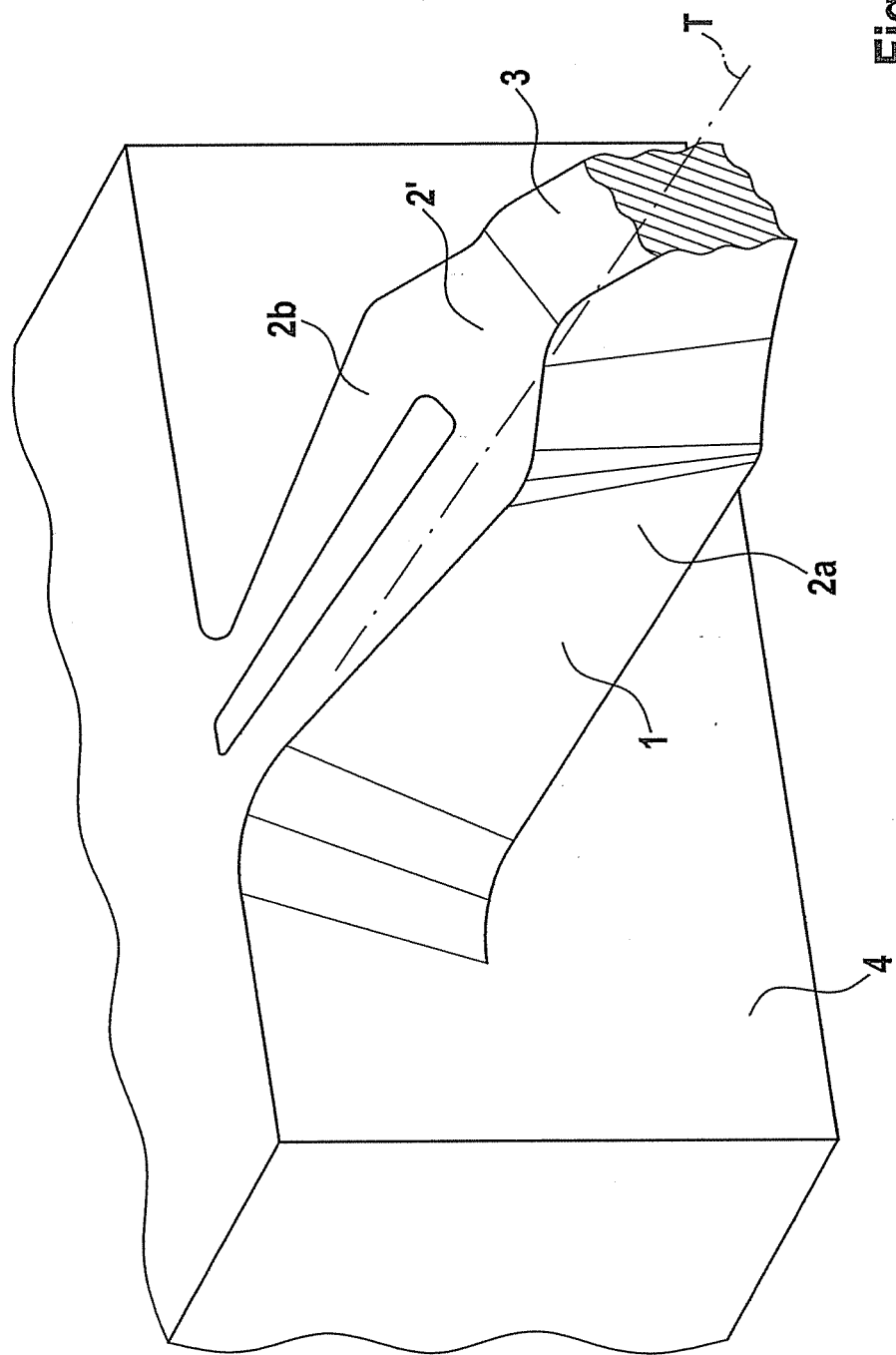
FIG. 1 shows a perspective representation of a connecting structure according to a first specific embodiment of the present invention.

In the figures, the same reference numerals identify identical or functionally identical elements.

FIG. 1 shows a perspective representation of a connecting structure according to a first specific embodiment of the present invention.

In FIG. 1, reference numeral 1 identifies a connecting structure for micromechanical oscillating devices according to the first specific embodiment of the present invention. Connecting structure 1 has a largely U-shaped design and includes two legs 2a, 2b, which extend parallel to a rotation axis T of a micromechanical oscillating structure 4. Connecting structure 1 is connected via the two legs 2a, 2b to micromechanical oscillating structure 4, which is rotatable around rotation axis T, and the connecting structure is connected to an elastic element 3 via a leg 2', which extends perpendicularly to rotation axis T and connects the two legs 2a, 2b. FIG. 1 largely shows a torsion around rotation axis T of connecting structure 1 in the clockwise direction. U-shaped connecting structure 1 is designed in such a way that legs 2a, 2b, which run parallel to torsion axis T, are longer than transverse leg 2' by a factor of three. Resistors in the form of flat conductor tracks, which are situated on legs 2a, 2b and whose width is less than the width of the particular leg, are not shown. A distance between legs 2a, 2b is half the size of the extension of transverse leg 2' perpendicular to rotation axis T.

FIG. 2 shows a connecting structure according to a second and a third specific embodiment of the present invention, including variably situated resistance elements 5a, 5b, 5c, 5d.

Figure 2B:
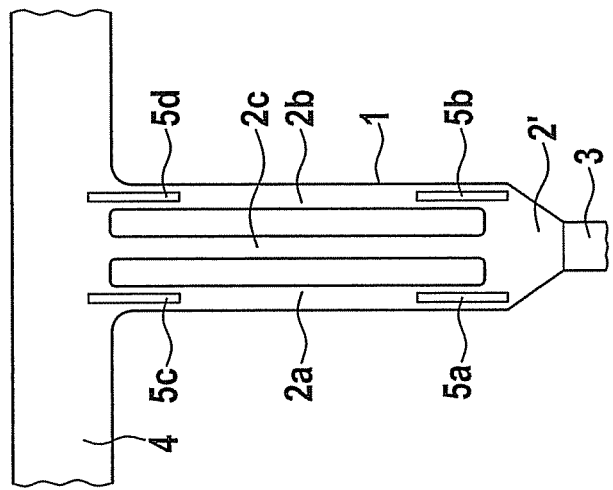
FIG. 2 shows a connecting structure according to a second and a third specific embodiment of the present invention, including variably situated resistors.
Figure 2A:
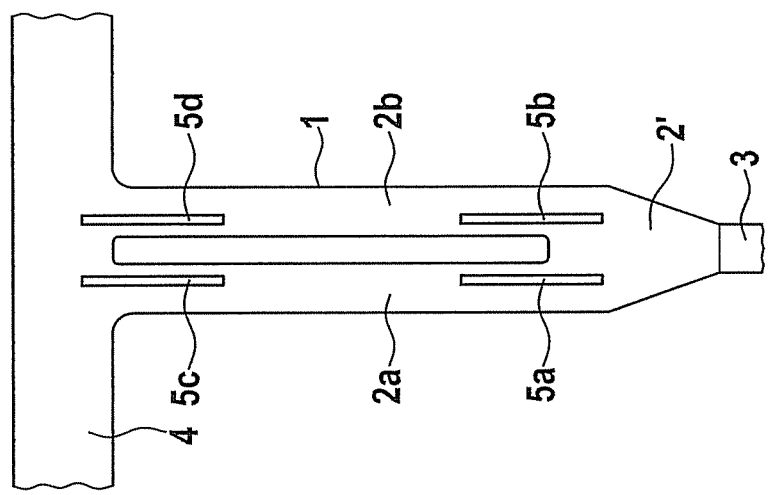

FIG. 2a shows a schematic representation of the system of resistors 5a, 5b, 5c, 5d on connecting structure 1. Resistors 5a, 5c, which are designed in the form of flat conductor tracks, are situated on leg 2a, and resistors 5b, 5d are situated on leg 2b. Resistors 5a, 5b, 5c, 5d extend parallel to the extension of particular legs 2a, 2b. Resistors 5a, 5b are provided in the area of transverse leg 2' and in the area of the connection between connecting structure 1 and elastic element 3, while resistors 5c, 5d are provided in the area of the connection between legs 2a, 2b and micromechanical oscillating structure 4. Resistors 5a, 5b, 5c, 5d are therefore situated in the area of the highest possible mechanical stresses, in particular tensile and/or compression stresses, when micromechanical oscillating structure 4 is twisted.

FIG. 2b shows a further specific embodiment of connecting structure 1. Connecting structure 1 includes three parallel legs 2a, 2b, 2c, which are connected to a transverse leg 2', in a manner similar to FIG. 2a. Two of resistors 5a, 5b, 5c, 5d are situated on the two outer legs 2a, 2b, respectively. A supply conductor track of a flat design (not illustrated) for a supply voltage for resistors 5a, 5b, 5c, 5d is situated on inner leg 2c, which is situated between the two legs 2a, 2b. This conductor track branches in the area of transverse leg 2' to enable voltage to be applied to resistors 5a, 5c and 5b 5d, respectively, which are situated on different legs 2a, 2b.

FIG. 3 shows a connecting structure according to a fourth and a fifth specific embodiment of the present invention. FIG. 3a shows a specific embodiment according to FIG. 2a having corresponding conductor tracks of a flat design, which are partially designed as resistors. The arrangement of the conductor tracks on leg 2a is described below. Accordingly, leg 2b is structured in a similar manner, including conductor track $L_b$ and tap lines $A_3$, $A_4$.

In the top view according to FIG. 3a, a supply line Z in the form of a flat conductor track, which extends in a parallel manner on leg 2a from micromechanical oscillating structure 4 to the area of transverse leg 2', is shown on the left side of leg 2a. There, supply line Z is electrically connected to a conductor track $L_a$. Resistors 5a, 5c are designed to be part of conductor track $L_a$, which extends parallel to supply line Z on leg 2a. This conductor track has a widened section V in the center of leg 2a. A tap line $A_1$, which further extends parallel to conductor track $L_a$ in the direction of micromechanical oscillating structure 4 on leg 2a and which is connected to the center of widened section V, is situated in the center of this widened section V on the side facing left according to FIG. 3a. The further course of conductor track $L_a$ between widened section V and micromechanical oscillating structure 4 then forms second resistor 5c, to which a further tap line $A_2$ is connected. Resistors 5a, 5c form two resistors in a Wheatstone bridge, which is formed from a total of four resistors. The two other resistors 5b, 5d of the Wheatstone bridge ($A_1$, $A_2$, $A_3$, $A_4$, 5a, 5b, 5c, 5d) are likewise formed by resistors 5b, 5d having conductor tracks $L_b$ on second leg 2b and are therefore situated or designed in a manner similar to resistors 5a, 5c.

FIG. 3b shows a similar specific embodiment according to FIG. 2b, including three legs 2a, 2b, 2c. The difference from FIG. 3a lies in the fact that supply line Z is situated on inner leg 2c. This makes it possible to provide legs 2a, 2b with a narrower design, since only the two sets of tap lines $A_1$, $A_2$ and $A_3$, $A_4$, respectively, need to be situated on leg 2a and likewise on leg 2b for voltage tapping. Furthermore, outer leg 2b is provided with a widened leg section $V_s$ in its inner area, i.e., in the area located at a distance from its ends, which are provided with micromechanical oscillating structure 4, on the one hand, and with elastic element 3, on the other hand. Widened leg section $V_s$ is situated on the outside of leg 2b. Within the scope of the present invention, however, this section may be situated also or only on the inside of a leg. Of course, further outer leg 2a may also be provided with one or more widened leg sections $V_s$.

FIG. 4 shows a top view of a sixth and a seventh specific embodiment of a connecting structure 1 according to the present invention. In contrast to FIG. 3a, FIG. 4a shows a tapping structure in the form of a quintuple meander M, which is situated on connecting structure 1. Only the structure of leg 2a and its tapping structure are described below. The design of leg 2b having tapping structure and tap $A_R$ is therefore similar to that of leg 2a having tap $A_L$.

In contrast to FIG. 3a, supply line Z is situated on the inside of leg 2a, i.e., on the side of leg 2a which faces leg 2b, and—like in FIG. 3a—it extends from micromechanical oscillating structure 4 on leg 2a in the direction of transverse leg 2'. Resistor 5a, widened section V, resistor 5c and tap line $A_2$ are first shown on the outside of leg 2a, from bottom to top. Center tapping $A_L$ using tap line $A_1$ according to FIG. 3a does not take place via a tap line $A_1$, situated on leg 2a, but instead tapping $A_L$ takes place via a tapping structure M, which is situated perpendicularly to leg 2a in the area of the center of widened section V. Tapping structure M having tap $A_L$ is provided with a meandering design having a quintuple meander M and includes a corresponding tap line $A_1$ or $A_4$, which is connected in an electrically conductive manner to the center of widened section V and to conductor track $L_a$.

FIG. 4b shows a system of three legs 2a, 2b, 2c according to FIG. 3b, a tapping structure M having taps $A_L$, $A_R$, in turn, being situated perpendicularly to legs 2a, 2b, as shown in FIG. 4a. Only the design of leg 2a is described below; leg 2b, including tapping structure M situated thereon, is designed to have a similar structure. A supply line Z for supplying voltage for resistors 5a, 5c on leg 2a and for resistors 5b, 5d on leg 2b is situated on center leg 2c. Only tap line $A_2$, resistors 5a, 5c and widened section V are situated on leg 2a. A tap $A_L$ is situated on widened section V perpendicularly thereto. Legs 2a, 2b must therefore be designed to be wide enough to enable a tap line $A_2$ to be situated thereupon.

Connecting structure 1 according to the present invention produces a mechanical stress in the location of specific resistors 5a, 5b, 5c, 5d when micromechanical oscillating structure 4 undergoes torsion, the mechanical stress being high enough to enable a twisting of connecting structure 1 to be measured with a precision of 0.05 fs. The input voltage for Wheatstone measuring bridge 5a, 5b, 5c, 5d may be, for example, a maximum of 3 V. Since a portion of this voltage drops at supply lines Z for resistors 5a, 5b, 5c, 5d, resistances 5a, 5b, 5c, 5d should be dimensioned as large as possible in comparison to the inner resistance of supply line Z. By way of example, the Wheatstone measuring bridge may have, for example, a sensitivity of 2.6 mV/° upon absorption of a torsion around 7.5° and a resolution of 0.05%, a voltage drop of 1 V at the Wheatstone measuring bridge as well as a resolution of 10 μV of a detecting device for evaluating the measured values of the Wheatstone bridge to ascertain the torsions. The detecting device is designed in the form of an application-specific integrated circuit.

The sheet resistance of common metal platings for supply and discharge lines is approximately 0.05 Ω/μm², and a layer resistance of common diffusions is approximately 50 Ω/μm². The meander of taps $A_L$, $A_R$ may be approximately 10 mm long and approximately 10 μm wide. If metal is used as tap line $A_1$, $A_4$, the total resistance of the meander is at approximately 50Ω, for diffusions at approximately 50 kΩ.

Although the present invention was described above on the basis of preferred exemplary embodiments, it is not limited thereto, but may be modified in many different ways.

What is claimed is:

1. A connecting structure for a micromechanical oscillating structure, the connecting structure being at least indirectly connectable to the micromechanical oscillating structure, on the one hand, and to an elastic element on the other hand, for the purpose of measuring torsions of the micromechanical oscillating structure, the connecting structure comprising:
   an extension including at least one leg situated in parallel to a rotation axis of the micromechanical oscillating structure and at least one further leg situated perpendicularly to the rotation axis, wherein a length of the extension parallel to the rotation axis is at least two-and-a-half times a length of the extension perpendicular to the rotation axis; and
   at least one resistance element situated on the extension to measure torsions of the connecting structure, the resistance element being situated in an area of increased mechanical stress when the connecting structure undergoes torsion.

2. The connecting structure as recited in claim 1, wherein the resistance element includes at least four resistors, arranged in the form of a Wheatstone bridge, which are provided in an area of the connection at least one of between the connecting structure and the micromechanical oscillating structure, and between the connecting structure and the elastic element.

3. The connecting structure as recited in at least claim 1, wherein the resistance element includes at least one piezoresistive crystal, a <110> direction of the piezoresistive crystal being situated parallel to the rotation axis.

4. The connecting structure as recited in at least claim 1, wherein the at least one leg includes at least three legs, and wherein the resistance element is situated on at least one outer one of the legs.

5. The connecting structure as recited in claim 1, wherein the at least one leg includes at least three legs, and wherein a supply line for supplying voltage to the resistance element is situated on an inner one of the legs.

6. The connecting structure as recited in claim 5, wherein the supply line is established using deep diffusion at a depth of more than 1 μm.

7. The connecting structure as recited in claim 5, wherein the supply line is established at a depth of more than 8 μm.

8. The connecting structure as recited in claim 5, wherein the supply line is established using shallow diffusion at a depth of less than 1 μm.

9. The connecting structure as recited in claim 4, wherein at least one outer one of the legs includes a widened leg section.

10. The connecting structure as recited in claim 8, wherein at least one resistor of the resistance element is a conductor track, and is situated in an inner area of at least one leg and includes a widened section.

11. The connecting structure as recited in claim 10, wherein the at least one resistor has a width of less than two micrometers in an area of at least one end of the at least one leg.

12. The connecting structure as recited in claim 1, wherein the at least one leg includes at least three legs, and wherein a tapping structure having a tap for tapping a voltage of at least one resistor is situated on at least one of the outer ones of the legs.

13. The connecting structure as recited in claim 10, wherein a Wheatstone bridge is formed in an area of the widened section.

14. The connecting structure as recited in claim 12, wherein the tapping structure includes a tap in the form of an at least triple meander.

15. The connecting structure as recited in claim 1, wherein the legs have a distance parallel to the rotation axis which is smaller than a length of the leg perpendicular to the rotation axis.

16. A micromechanical device, comprising:
a micromechanical oscillating mirror; and
a connecting structure at least indirectly connected to the micromechanical oscillating mirror, on the one hand, and to an elastic element on the other hand, for measuring torsions of the micromechanical oscillating mirror, the connecting structure including an extension including at least one leg situated in parallel to a rotation axis of the micromechanical oscillating structure and at least one further leg situated perpendicularly to the rotation axis, wherein a length of the extension parallel to the rotation axis is at least two-and-a-half times a length of the extension perpendicular to the rotation axis, and at least one resistance element situated on the extension to measure torsions of the connecting structure, the resistance element being situated in an area of increased mechanical stress when the connecting structure undergoes torsion.

* * * * *